United States Patent [19]  [11] 3,969,676
Driussi  [45] July 13, 1976

[54] ELECTRON BEAM IONIZATION SIGNAL SAMPLER

[75] Inventor: Conrad Driussi, Ridgecrest, Calif.

[73] Assignee: The United States of America as represented by the Secretary of the Navy, Washington, D.C.

[22] Filed: Apr. 17, 1975

[21] Appl. No.: 568,965

Related U.S. Application Data

[63] Continuation-in-part of Ser. No. 406,059, Oct. 12, 1973, abandoned.

[52] U.S. Cl. .............................. 328/121; 328/108; 328/124; 328/126; 328/151
[51] Int. Cl.² ..................... G11C 11/26; H03K 5/00
[58] Field of Search ........... 328/112, 124, 126, 151, 328/227, 229, 231, 121, 123, 108

[56] References Cited
UNITED STATES PATENTS
3,506,971  4/1970  Sakurai ......................... 328/123 X Primary Examiner—John Zazworsky
Attorney, Agent, or Firm—R. S. Sciascia; Roy Miller; Robert W. Adams

[57] ABSTRACT

A signal sampler based on electron ionization principles, and having a cathode ray tube including an electron gun and deflection plates, and several semiconductor targets positioned near the face of the CRT. The input signal is applied to the grid of the tube and modulates the intensity of the electron beam emitted by the electron gun. The targets are illuminated by the beam and the current produced is proportional to the electron density. By this method, wherein the beam is swept across the targets, and the input pulse is used to control the intensity of the beam, only one sweep is required to fully investigate the pulse. Investigation is accomplished by detecting and processing the current produced at each target.

1 Claim, 1 Drawing Figure

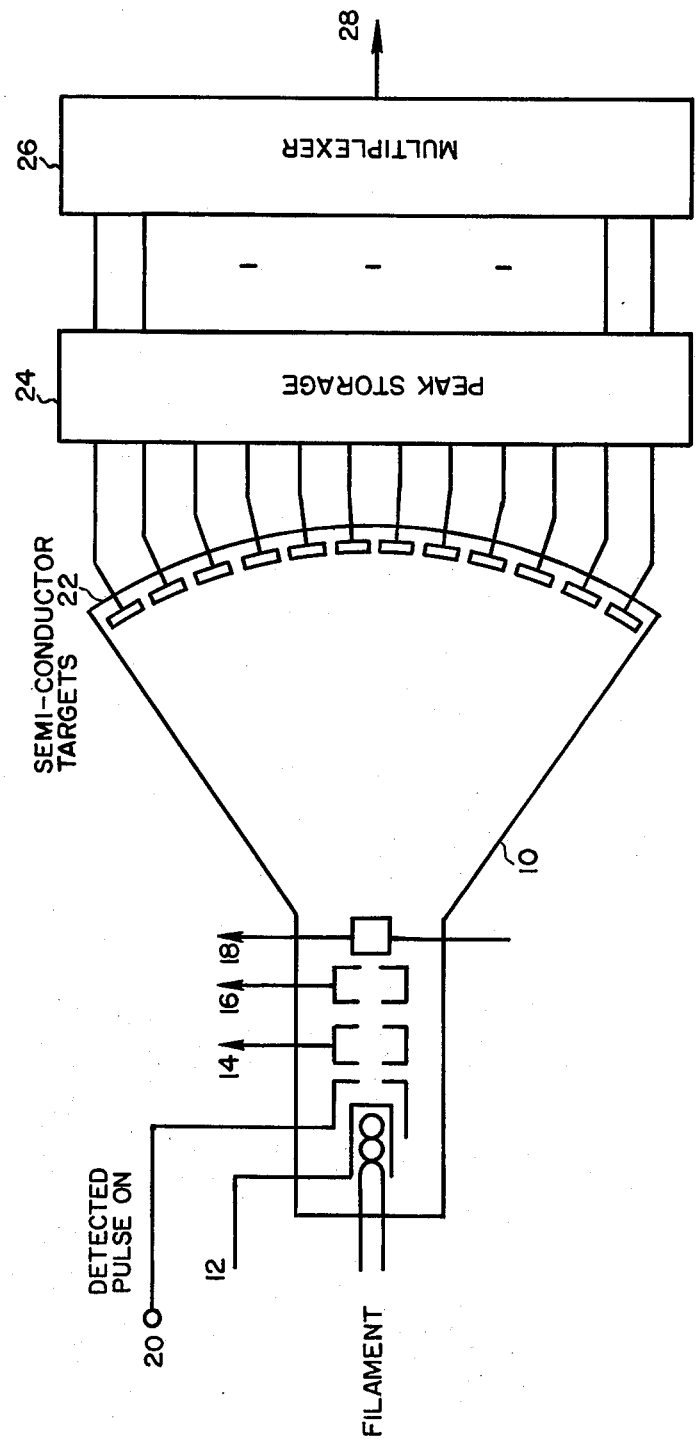

3,969,676

ELECTRON BEAM IONIZATION SIGNAL SAMPLER

REFERENCE TO PRIOR APPLICATION

The present application is a continuation-in-part of Applicant's prior copending United States Application for Letters Patent, Ser. No. 406,059, filed Oct. 12, 1973, abandoned.

BACKGROUND OF THE INVENTION

In the field of pulse samplers or pulse investigation devices, previous approaches have been restricted almost entirely to taking one sample per pulse. To take N number of samples, N number of pulses have been required.

An advantage of taking N number of samples in a single pulse is clear. By fully investigating each pulse, instead of sampling different parts of consecutive pulses, the system response time is easily increased a thousand percent or more. As a result, more information can be processed and analyzed in any given time period. Also, the characteristics appearing in only one, or so, of the input pulses will not be missed, but will be detected and analyzed.

BRIEF DESCRIPTION OF THE DRAWINGS

The FIGURE is a plan view, partially in block form of the preferred embodiment of the present invention.

DESCRIPTION OF THE PREFERRED EMBODIMENT

The FIGURE shows the electron beam ionization signal sampler of the present invention. The signal to be analyzed is coupled to a cathode ray tube 10 having a plurality of electron sensitive semiconductors 22 spaced along the face of the tube. The input pulse is coupled to input 20 and is used to control the intensity of the tube beam. The filament, the cathode 12, and the focusing and accelerating coils 14 and 16, respectively, and their associated circuitry, may be of a standard type used in other CRT applications. The deflection plates 18 are coupled to a deflection circuit that provides, for example, a ramp signal which causes the beam to sweep across the semiconductor target 22 at a rate that may be invariant as with fixed rate ramp generators, or at a rate that may be selected by the operator for the pulse or pulses to be interrogated. Ideally, the rate is chosen or selected to provide full deflection for each input pulse such that every target 22 is scanned. That is, if the input is a narrow pulse the deflection circuitry deflection rate is chosen or selected to sweep the beam at a rapid rate, and if the input is a wide pulse, the rate of deflection is chosen or selected to be slower. The system may employ some known means for storing or delaying the pulse to be processed so that the width of the pulse can be determined before it is coupled to the CRT. The deflection circuitry may be triggered by detection of the input pulse if desired such that beam scan can be initiated by the pulse to be interrogated. Any suitable known triggering technique or means may be employed.

Each semiconductor target 22 is separately connected to its peak storage device 24. Each target 22 is an electron sensitive semiconductor that provides a current proportional to the intensity of the beam to which it is exposed. The respective storage device 24 of each target stores the maximum, or peak, value detected by its target. As a result, each pulse is divided into a number of parts, with the number being equal to the number of targets 22 positioned along the face of the tube that are irradiated, and the amplitude characteristic of each part is separately detected and subsequently processed by the target and remaining circuitry of the present invention.

The peak storage device 24 provides a series of outputs to multiplexer 26, with each output dependent upon the part detected by the respective target 22. The signal is processed by the multiplexer into any format desirable for the intended application. The information processed is then coupled out of the system at output 28 for presentation or other utilization.

Any person skilled in the art would be able to make modifications in the system shown without departing from the substance of the invention. And, all such modifications are intended to be included within this disclosure as a part thereof. A separate pulse stretcher may be interposed between its target 22 and the respective peak storage device. The pulse stretcher may be necessary to effectively elongate the pulse in certain applications dependent upon the capabilities of the remainder of the circuitry utilized. Target 22 will inherently provide some elongation, which might itself be sufficient for many applications. It should be noted that the input is utilized to control the intensity of the beam as it is swept across targets 22.

Basically, the operation of the present invention is as follows: An input pulse which is to be investigated is coupled to the Z axis of the CRT. The deflection plates act to sweep the electron beam over the surface of the targets at a rate chosen or selected for the input pulse width. The Z axis acts to control the intensity of the beam throughout the pulse. The beam, thus controlled by the input, is swept across a series of targets 22 positioned near the surface of the CRT. If the input signal is a square wave, all of the targets 22 which detect the beam will generate equal currents. If the input signal is sinusoidal, the currents generated will vary in a sinusoidal fashion across the face of the CRT. And, if the input pulse is irregular, the amplitude of each successive part of the pulse will be systematically detected by the successive targets 22, in a like manner. The currents generated by each target 22 are coupled to its separate peak storage device 24 through, perhaps, a pulse stretcher. The respective peak storage device 24 holds the maximum value attained by its detector during the pulse until it can be processed by multiplexer 26. Multiplexer 26 processes the information obtained into a format for external use and provides the processed information at output 28. As a result, each part of the pulse under investigation is rapidly and successively analyzed before the next pulse is received at the input. The invention eliminates the necessity for examining N number of pulses to obtain N number of samples.

What is claimed is:
1. An electronic signal sampler for fully sampling each pulse received by the sampler, comprising;
    an input for receiving said pulses,
    a cathode ray tube envelope having a face and an electron beam,
    means coupled to said input for controlling the intensity of the electron beam in response to the electrical pulse received,
    means for deflecting said beam such that the beam traces a scan on the face of the envelope, a plurality of electron sensitive semi-conductors spaced along the inner surface of the face of the envelope, each for detecting at least a part of the beam and providing an output responsive to the intensity of the part detected, peak storage means coupled to said electron sensitive semi-conductors for separately storing the electrical charges corresponding to the amount of current generated by the respective semi-conductor for each pule, and a multiplexer coupled to said peak storage means for systematically processing all of the charges stored for each pulse and providing the sampler output. such that all parts of each pulse are sampled.

* * * * *